(12) United States Patent
Yang et al.

(10) Patent No.: US 11,219,130 B2
(45) Date of Patent: Jan. 4, 2022

(54) CIRCUIT BOARD AND MANUFACTURING METHOD THEREOF

(71) Applicant: Unimicron Technology Corp., Taoyuan (TW)

(72) Inventors: Kai-Ming Yang, Taoyuan (TW); Chen-Hao Lin, Keelung (TW)

(73) Assignee: Unimicron Technology Corp., Taoyuan (TW)

( * ) Notice: Subject to any disclaimer, the term of this patent is extended or adjusted under 35 U.S.C. 154(b) by 40 days.

(21) Appl. No.: 16/528,560

(22) Filed: Jul. 31, 2019

(65) Prior Publication Data
US 2020/0367364 A1  Nov. 19, 2020

(30) Foreign Application Priority Data

May 17, 2019  (TW) .................................. 108117096

(51) Int. Cl.
*H05K 1/11* (2006.01)
*H05K 3/10* (2006.01)
*H05K 3/18* (2006.01)
*H05K 3/24* (2006.01)

(52) U.S. Cl.
CPC ............... *H05K 3/108* (2013.01); *H05K 1/11* (2013.01); *H05K 3/18* (2013.01); *H05K 3/244* (2013.01); *H05K 2201/09781* (2013.01); *H05K 2203/0723* (2013.01)

(58) Field of Classification Search
CPC .......... H05K 2201/09709; H05K 2201/09781; H05K 1/11
See application file for complete search history.

(56) References Cited

U.S. PATENT DOCUMENTS

| 6,218,847 B1 * | 4/2001 | Matsushita .............. G01B 7/06 324/629 |
| 6,287,948 B1 * | 9/2001 | Ushiyama ......... H01L 21/32051 257/296 |

(Continued)

FOREIGN PATENT DOCUMENTS

| CN | 102821559 | 12/2012 |
| CN | 103151333 | 6/2013 |
| TW | I528517 | 4/2016 |

OTHER PUBLICATIONS

"Office Action of Taiwan Counterpart Application," dated Mar. 23, 2020, p. 1-p. 5.

(Continued)

*Primary Examiner* — Paresh H Paghadal
(74) *Attorney, Agent, or Firm* — JCIPRNET

(57) ABSTRACT

A circuit board including a substrate, a patterned conductive layer, a patterned insulating layer, a conductive terminal, and a dummy terminal is provided. The patterned conductive layer is disposed on the substrate. The patterned insulating layer is disposed on the substrate and at least covers a portion of the patterned conductive layer. The conductive terminal is disposed on the patterned conductive layer and has a first top surface. The dummy terminal is disposed on the patterned conductive layer and has a second top surface. A first height between the first top surface and the substrate is greater than a second height between the second top surface and the substrate.

9 Claims, 16 Drawing Sheets

(56) References Cited

U.S. PATENT DOCUMENTS

| | | | |
|---|---|---|---|
| 6,407,345 B1* | 6/2002 | Hirose | H05K 1/113 174/261 |
| 7,926,829 B2* | 4/2011 | Bender | B60D 1/665 280/406.1 |
| 9,661,761 B2* | 5/2017 | Lin | H05K 3/4682 |
| 9,723,729 B2 | 8/2017 | Furusawa et al. | |
| 9,820,391 B2* | 11/2017 | Shimizu | H01L 24/13 |
| 9,859,201 B2* | 1/2018 | Shimizu | H01L 23/49838 |
| 10,383,208 B2* | 8/2019 | Leitgeb | H05K 3/0061 |
| 10,580,665 B2* | 3/2020 | Lin | H01L 23/3192 |
| 10,674,604 B2* | 6/2020 | Ishihara | H01L 23/49827 |
| 2001/0038531 A1* | 11/2001 | Asai | H01L 23/49816 361/794 |
| 2003/0172526 A1* | 9/2003 | Komatsubara | H05K 3/108 29/846 |
| 2010/0140800 A1* | 6/2010 | Hagihara | H05K 1/0271 257/737 |
| 2010/0293515 A1* | 11/2010 | Inoue | G06F 17/5081 716/130 |
| 2011/0048783 A1* | 3/2011 | Yu | H05K 3/465 174/261 |
| 2012/0247823 A1* | 10/2012 | Kasai | H05K 3/3452 174/261 |
| 2012/0312590 A1* | 12/2012 | Maeda | H05K 1/0269 174/261 |
| 2014/0360761 A1* | 12/2014 | Seo | H05K 3/4644 174/251 |
| 2015/0062849 A1 | 3/2015 | Adachi et al. | |
| 2015/0107880 A1* | 4/2015 | Kim | H05K 1/185 174/255 |
| 2015/0145628 A1* | 5/2015 | Kim | H01F 5/00 336/137 |
| 2015/0179560 A1* | 6/2015 | Arisaka | H05K 1/0366 257/777 |
| 2015/0223330 A1* | 8/2015 | Oi | H05K 3/4661 361/767 |
| 2015/0245473 A1* | 8/2015 | Shimizu | H05K 1/0298 257/778 |
| 2016/0360609 A1* | 12/2016 | Lee | H05K 3/4682 |
| 2017/0053878 A1* | 2/2017 | Kajihara | H01L 23/5389 |
| 2018/0151495 A1* | 5/2018 | Hsu | H01L 23/5283 |
| 2019/0198433 A1* | 6/2019 | Kitajo | H01L 23/49838 |

OTHER PUBLICATIONS

"Office Action of China Counterpart Application", dated May 7, 2021, p. 1-p. 9.

* cited by examiner

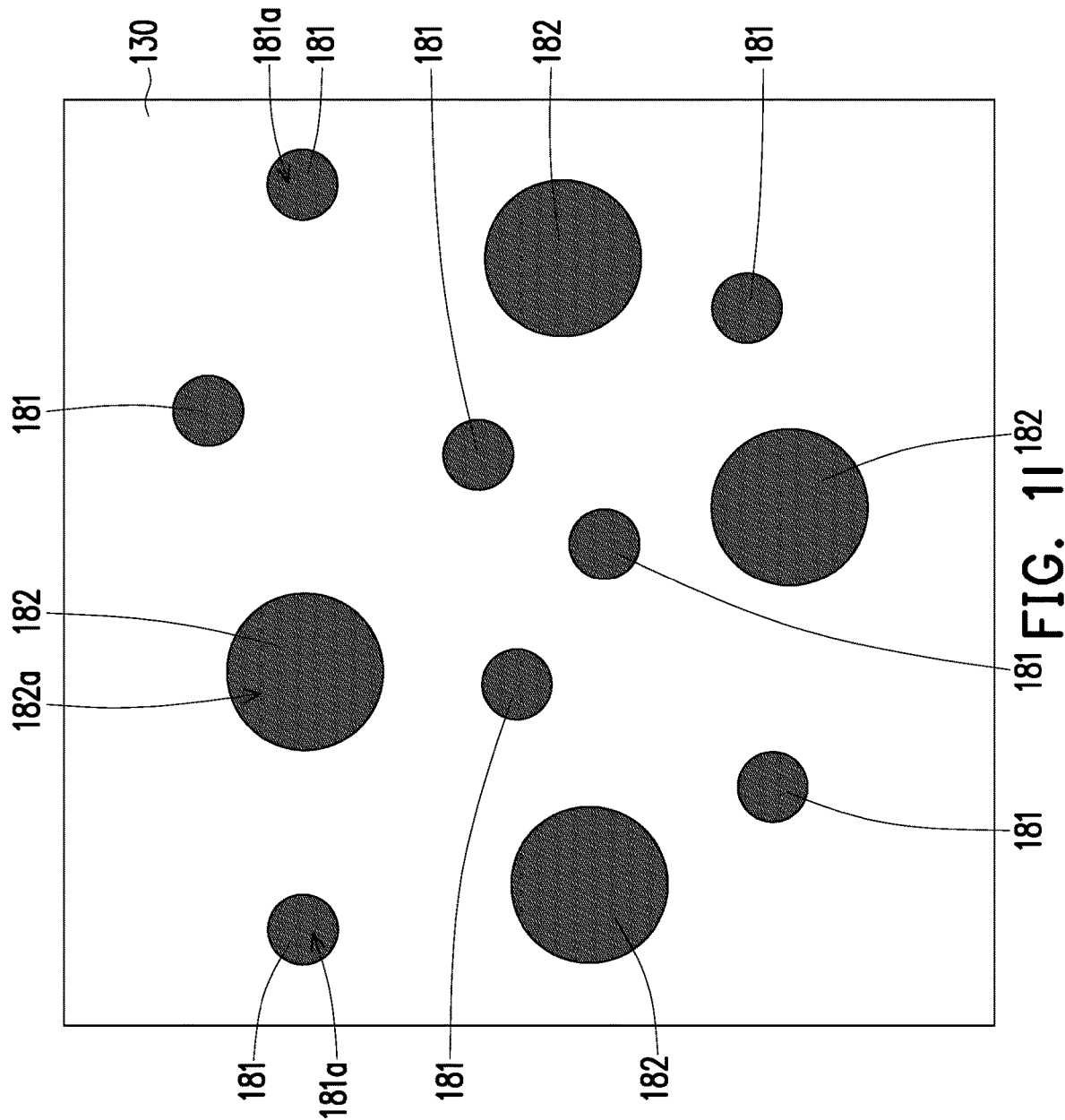

CIRCUIT BOARD AND MANUFACTURING METHOD THEREOF

CROSS-REFERENCE TO RELATED APPLICATION

This application claims the priority benefit of Taiwan application serial no. 108117096, filed on May 17, 2019. The entirety of the above-mentioned patent application is hereby incorporated by reference herein and made a part of this specification.

BACKGROUND

Technical Field

This invention relates to an electronic component and a manufacturing method thereof, and in particular relates to a circuit board and a manufacturing method thereof.

Description of Related Art

A manufacturing method of a circuit board often include an electroplating process. However, in the electroplating process, flash plating or skip plating may decrease the yield or quality of the circuit board.

SUMMARY

The disclosure relates to a circuit board and a manufacturing method thereof, which have better yield or quality.

A circuit board of the invention includes a substrate, a patterned conductive layer, a patterned insulating layer, a conductive terminal, and a dummy terminal. The patterned conductive layer is disposed on the substrate. The patterned insulating layer is disposed on the substrate and at least covers a portion of the patterned conductive layer. The conductive terminal is disposed on the patterned conductive layer and has a first top surface. The dummy terminal is disposed on the patterned conductive layer and has a second top surface. A first height between the first top surface and the substrate is greater than a second height between the second top surface and the substrate.

In an embodiment of the invention, the conductive terminal and the dummy terminal are electrically separated from each other.

In an embodiment of the invention, the substrate has a first surface, the patterned conductive layer is disposed on the first surface of the substrate, and a ratio of a sum of a projected area of the conductive terminal on the first surface and a projected area of the dummy terminal on the first surface to a surface area of the first surface is greater than or equal to 10% and less than 100%.

In an embodiment of the invention, a ratio of the projected area of the conductive terminal on the first surface to the surface area of the first surface is greater than or equal to 1% and less than or equal to 5%.

In an embodiment of the invention, the patterned insulating layer has a third top surface, and a third height between the third top surface and the substrate is greater than the second height between the second top surface and the substrate.

In an embodiment of the invention, the substrate has a first surface, the patterned conductive layer is disposed on the first surface of the substrate, and a projected area of the conductive terminal on the first surface is smaller than a projected area of the dummy terminal on the first surface.

In an embodiment of the invention, a maximum thickness of the dummy terminal is greater than a thickness of the patterned conductive layer.

In an embodiment of the invention, a surface roughness of the first top surface is smaller than a surface roughness of the second top surface.

In an embodiment of the invention, a surface roughness of the first top surface is substantially equal to a surface roughness of the second top surface.

A manufacturing method of a circuit board of the invention includes the following steps: providing a substrate; forming a patterned conductive layer on the substrate, wherein the patterned conductive layer comprises a contact area and a dummy plating area; forming a patterned insulating layer on the substrate, wherein the patterned insulating layer at least covers a portion of the patterned conductive layer; forming a plating seed layer on the patterned insulating layer, wherein the plating seed layer covers a portion of the patterned conductive layer; forming a plating mask layer on the plating seed layer, wherein the plating mask layer has a plating opening and a dummy plating opening, the plating opening corresponds to the contact area, and the dummy plating opening corresponds to the dummy plating area; forming a plating layer within the plating opening and the dummy plating opening; and removing the plating mask layer and a portion of the plating seed layer to form a conductive terminal corresponding to the contact area and a dummy terminal corresponding to the dummy plating area.

In an embodiment of the invention, the contact area and the dummy plating area are electrically separated from each other before forming the plating seed layer; after the step of forming the plating seed layer and before the step of removing a portion of the plating seed layer, the contact area and the dummy plating area are electrically connected to each other; and the conductive terminal and the dummy terminal are electrically separated from each other.

In an embodiment of the invention, the dummy plating area of the patterned conductive layer comprises a plurality of strip structures.

In an embodiment of the invention, the dummy plating area of the patterned conductive layer comprises a block structure.

In an embodiment of the invention, the substrate has a first surface, and the patterned conductive layer is formed on the first surface of the substrate; and a ratio of a sum of an opening area of the plating opening and an opening area of the dummy plating opening to a surface area of the first surface is greater than or equal to 10% and less than 100%.

In an embodiment of the invention, a ratio of the opening area of the plating opening to the surface area of the first surface is greater than or equal to 1% and less than or equal to 5%.

A manufacturing method of a circuit board of the invention includes the following steps: providing a substrate; forming a patterned conductive layer on the substrate; forming a patterned insulating layer on the substrate, wherein the patterned insulating layer at least covers a portion of the patterned conductive layer; forming a plating seed layer on the patterned insulating layer, wherein the plating seed layer covers a portion of the patterned conductive layer; forming a plating mask layer on the plating seed layer, wherein the plating mask layer has a plating opening and a dummy plating opening, the plating opening corresponds to the contact area, and the dummy plating opening does not overlap the patterned conductive layer; forming a plating layer within the plating opening and the dummy plating opening; and removing the plating mask layer and a portion of the plating seed layer to form a conductive terminal corresponding to the contact area and a dummy terminal, wherein the dummy terminal does not overlap the patterned conductive layer.

In summary, in the manufacturing method of a circuit board, the plating area in an electroplating process may be improved by a dummy plating opening. As such, in the electroplating process, the possibility of flash plating or skip plating may be reduced, and the yield or quality of the circuit board may be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1I is a top view of a manufacturing method of a circuit board according to a first embodiment of the invention.

DESCRIPTION OF THE EMBODIMENTS

Figure 1A:
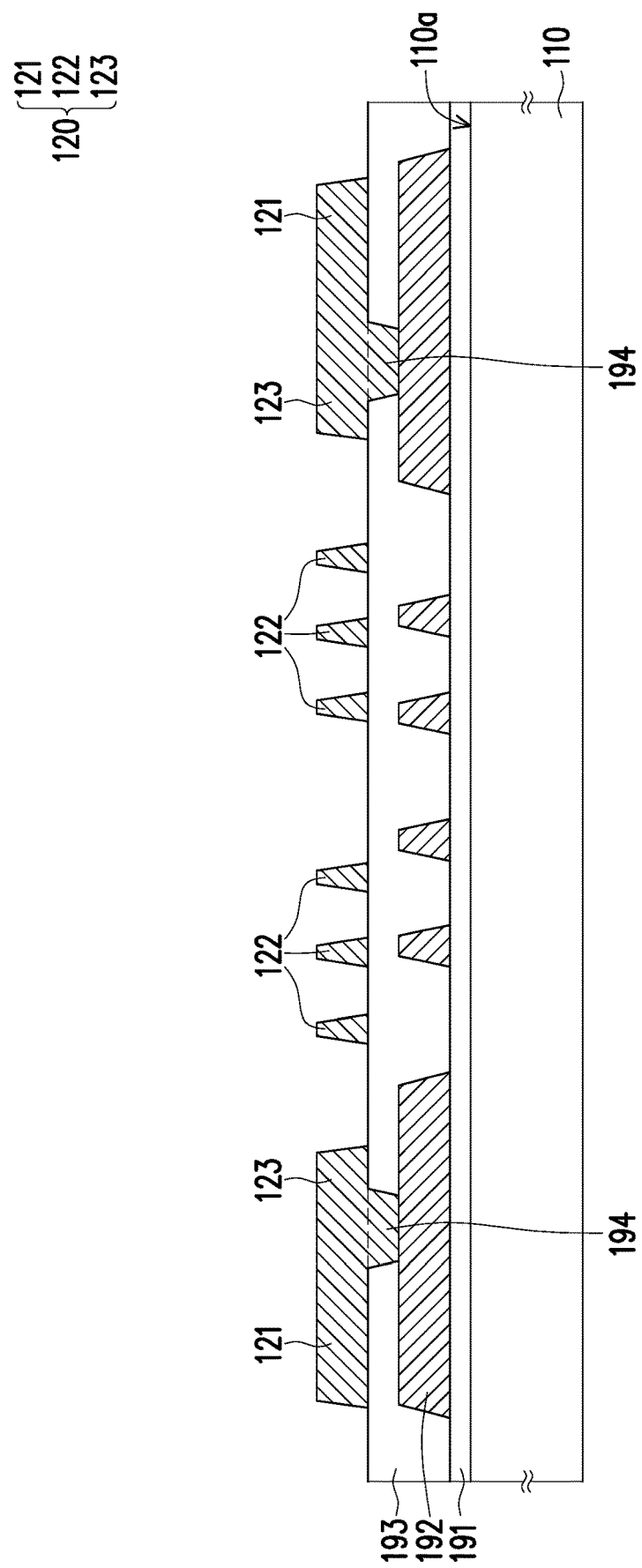
FIG. 1A to FIG. 1G are cross-sectional views of a manufacturing method of a circuit board according to a first embodiment of the invention.

In this regard, directional terminology, such as "up," "top", "bottom", etc., is used with reference to the orientation of the Figure(s) being described. As such, the directional terminology is used for purposes of illustration and is in no way limiting.

In the detailed description of the embodiments, the terms "first", "second", "third" and the like may be used to describe different elements. These terms are only used to distinguish elements from each other, but in the structure, these elements may not be limited by these terms. For example, a first element may be referred to as a second element, and similarly, a second element may be referred to as a first element without departing from the scope of the inventive concept. In addition, in the manufacturing method, the formation of these elements or components may not be limited by these terms except for a specific process flow. For example, the first element may be formed before the second element. Or, the first element may be formed after the second element. Alternatively, the first element and the second element may be formed in the same process or step.

The thickness of layer(s) or region(s) in the drawings may be exaggerated for clarity. The same or similar reference numerals may indicate the same or similar elements, and have the same or similar materials, formation manners or configurations, and the following descriptions will not be repeated.

FIG. 1A to FIG. 1G are cross-sectional views of a manufacturing method of a circuit board according to a first embodiment of the invention. FIG. 1H is a top view of a manufacturing method of a circuit board according to a first embodiment of the invention. FIG. 1I is a top view of a manufacturing method of a circuit board according to a first embodiment of the invention. For example, FIG. 1H may be a top view corresponding to the structure in FIG. 1B, and FIG. 1I may be a top view corresponding to the structure in FIG. 1F. Further, a part of the film layer or element may be omitted in FIG. 1A to FIG. 1I for clarity.

Referring to FIG. 1A, a substrate 110 is provided. The material of the substrate 110 is not limited in the present invention. For example, the substrate 110 may be a rigid substrate adapted to support a film layer or element formed thereon in a subsequent process. For another example, the substrate 110 may be a flexible substrate, and the aforementioned flexible substrate may be disposed on a carrier (not shown).

Referring to FIG. 1A, a patterned conductive layer 120 is formed on the first surface 110a of the substrate 110. The conductive material and the manner of forming the patterned conductive layer 120 are not limited in the present invention.

In the embodiment, other layer(s), elements(s), or device(s) may be disposed between the patterned conductive layer 120 and the substrate 110 depending on the design or requirement. For example, a release layer 191 may be disposed on the first surface 110a of the substrate 110, and the circuit layer may be disposed on the release layer 191. An insulating layer 193 may be disposed between the circuit layer 192 and the patterned conductive layer 120. A portion of the circuit layer 192 and a portion of the patterned conductive layer 120 may be electrically connected to each other through a corresponding conductive via 194. The conductive via 194 and the patterned conductive layer 120 may be formed by the same or similar processes, but the invention is not limited thereto.

In the embodiment, the patterned conductive layer 120 may include a contact area 121, a dummy plating area 122, and a circuit area 123. The circuit area 123 is connected to the contact area 121, and the dummy plating area 122 and the contact area 121 are separated from each other.

In an embodiment, the contact area 121 may be electrically separate the dummy plating area 122.

Figure 1B:
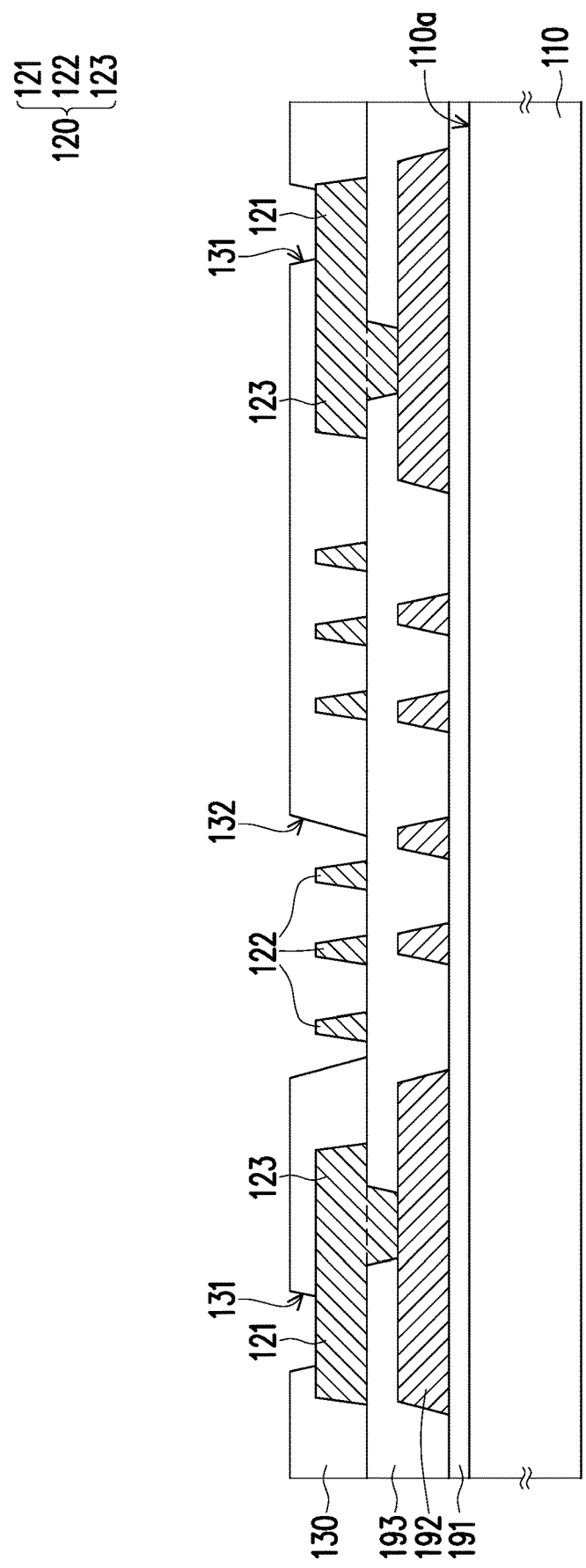
Figure 1C:
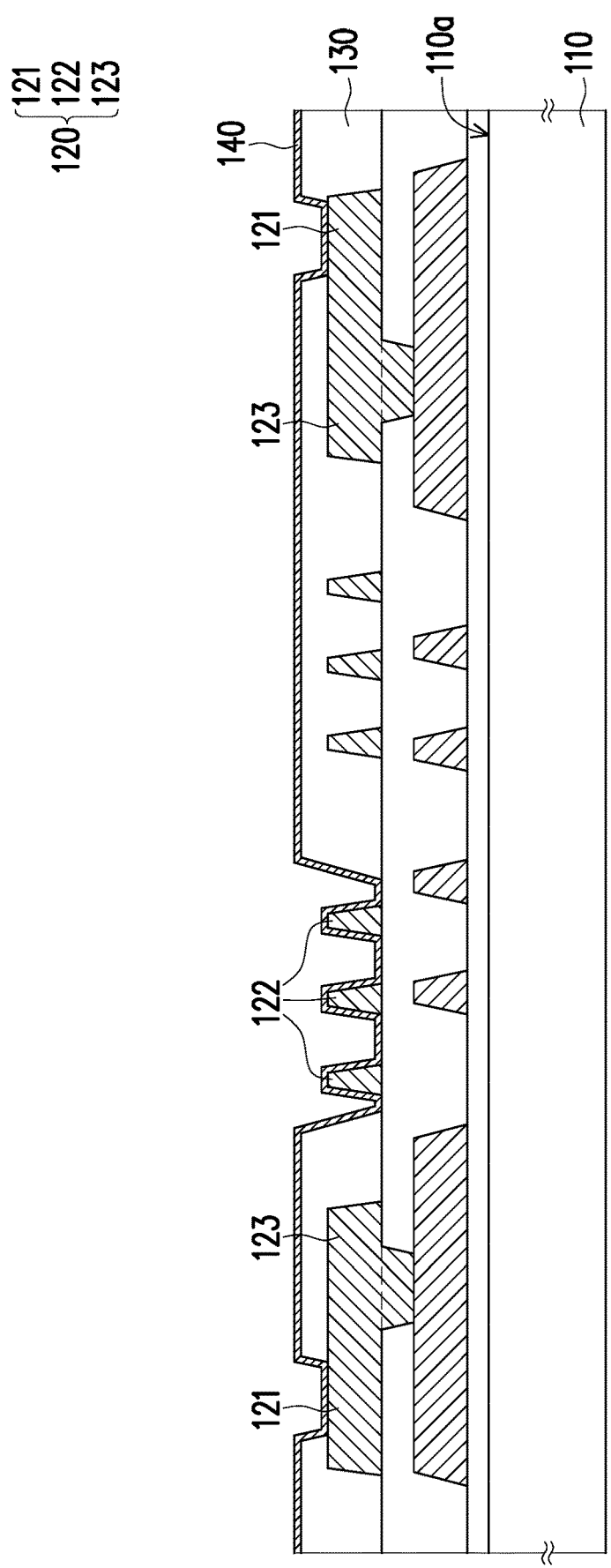
Figure 1D:
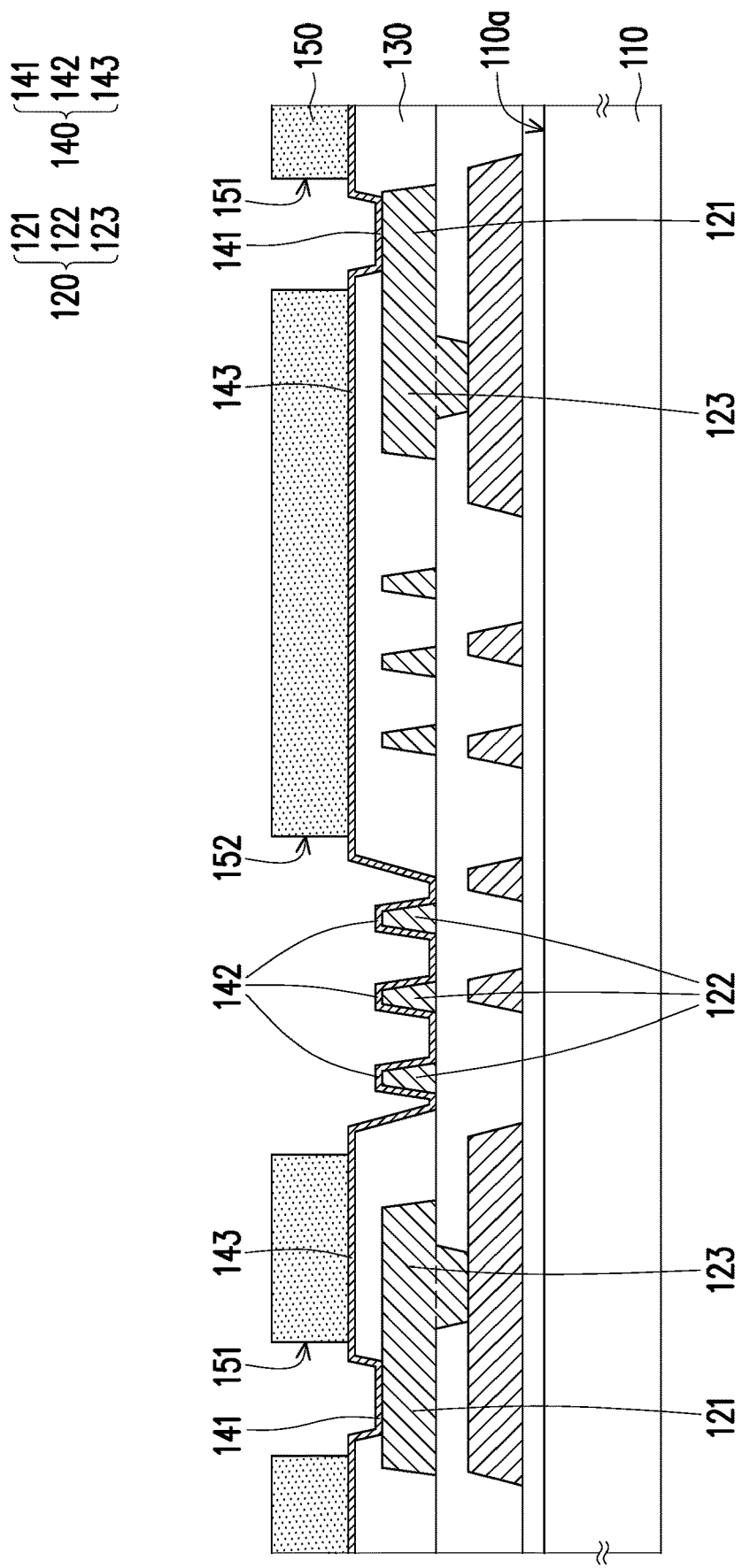
Figure 1E:
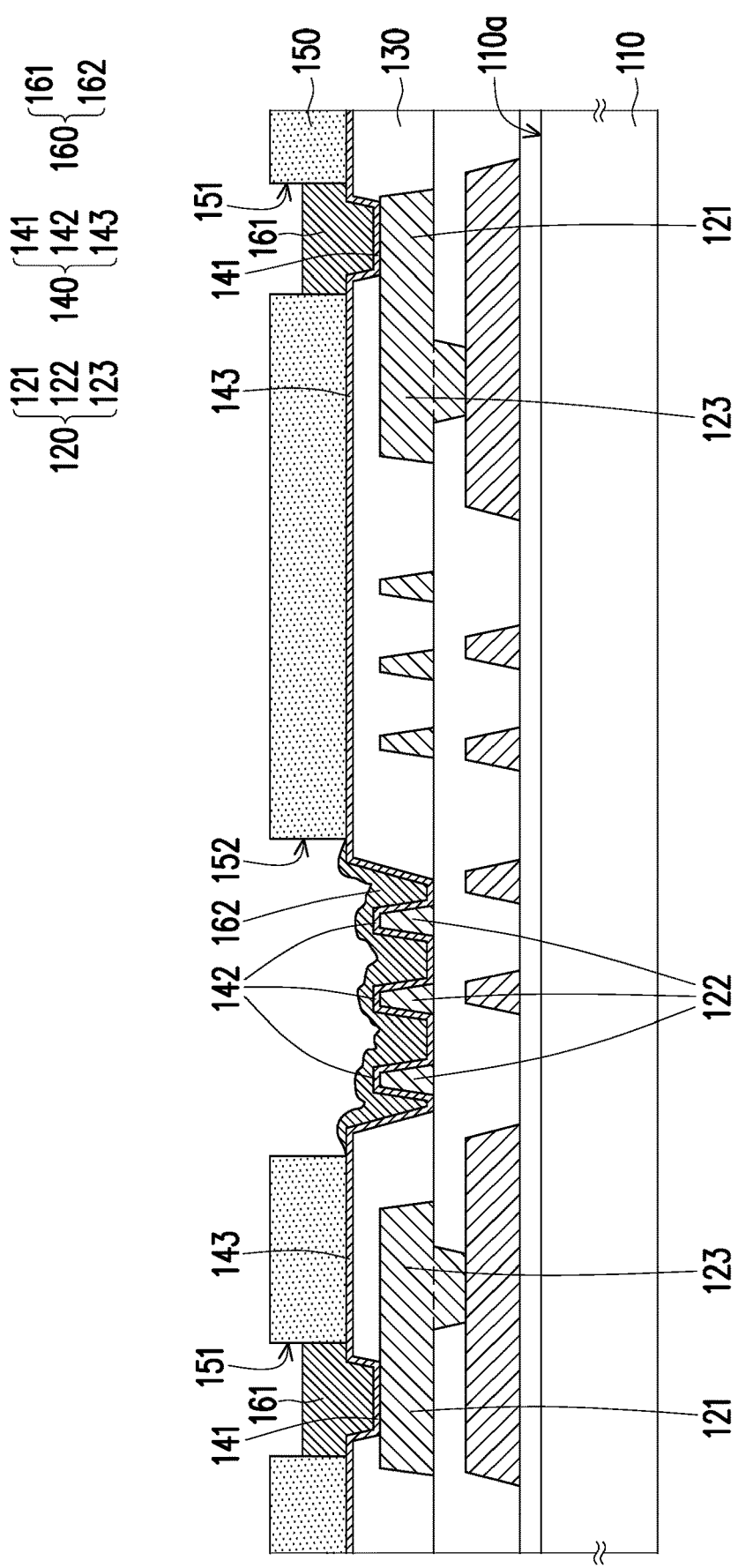
Figure 1F:
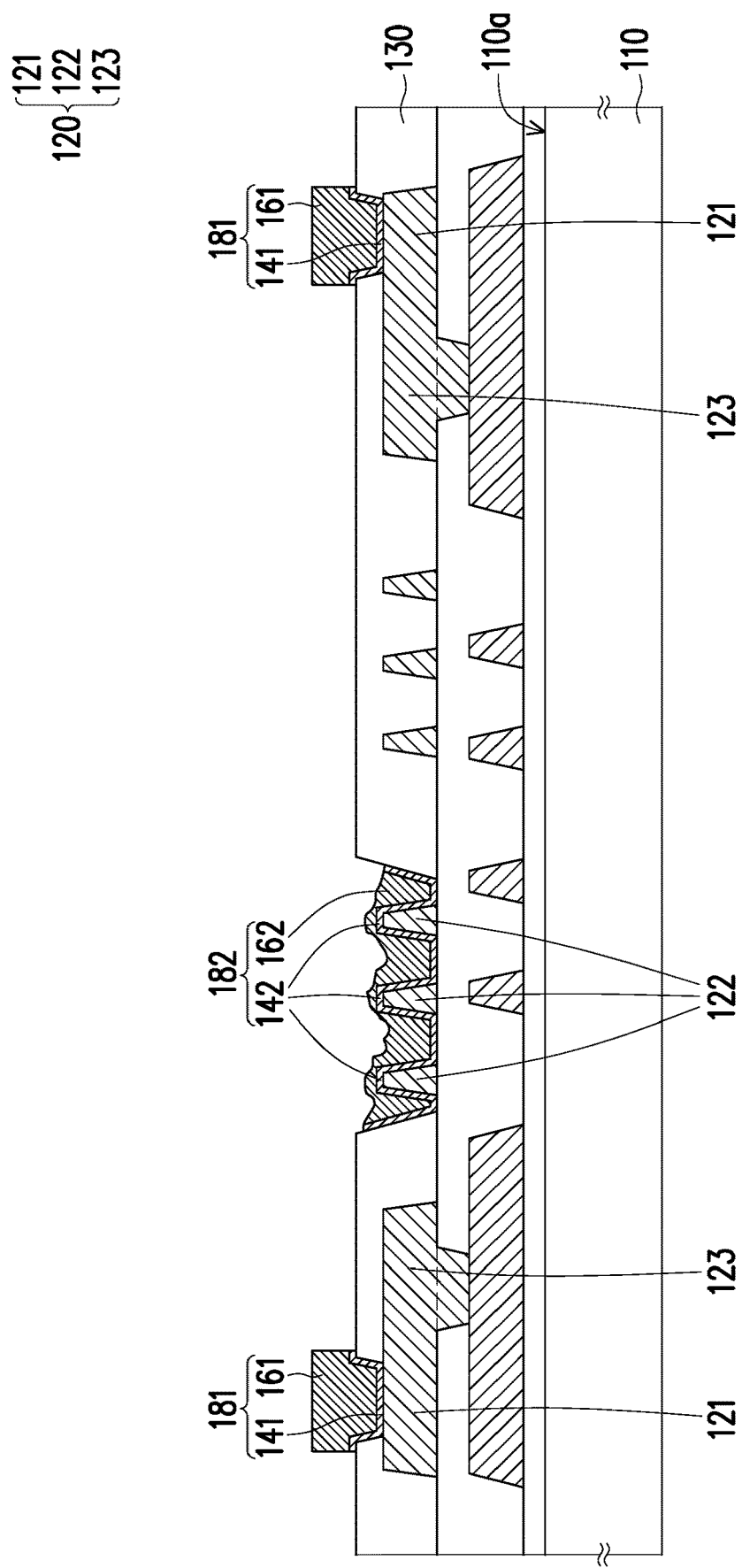
Figure 1G:
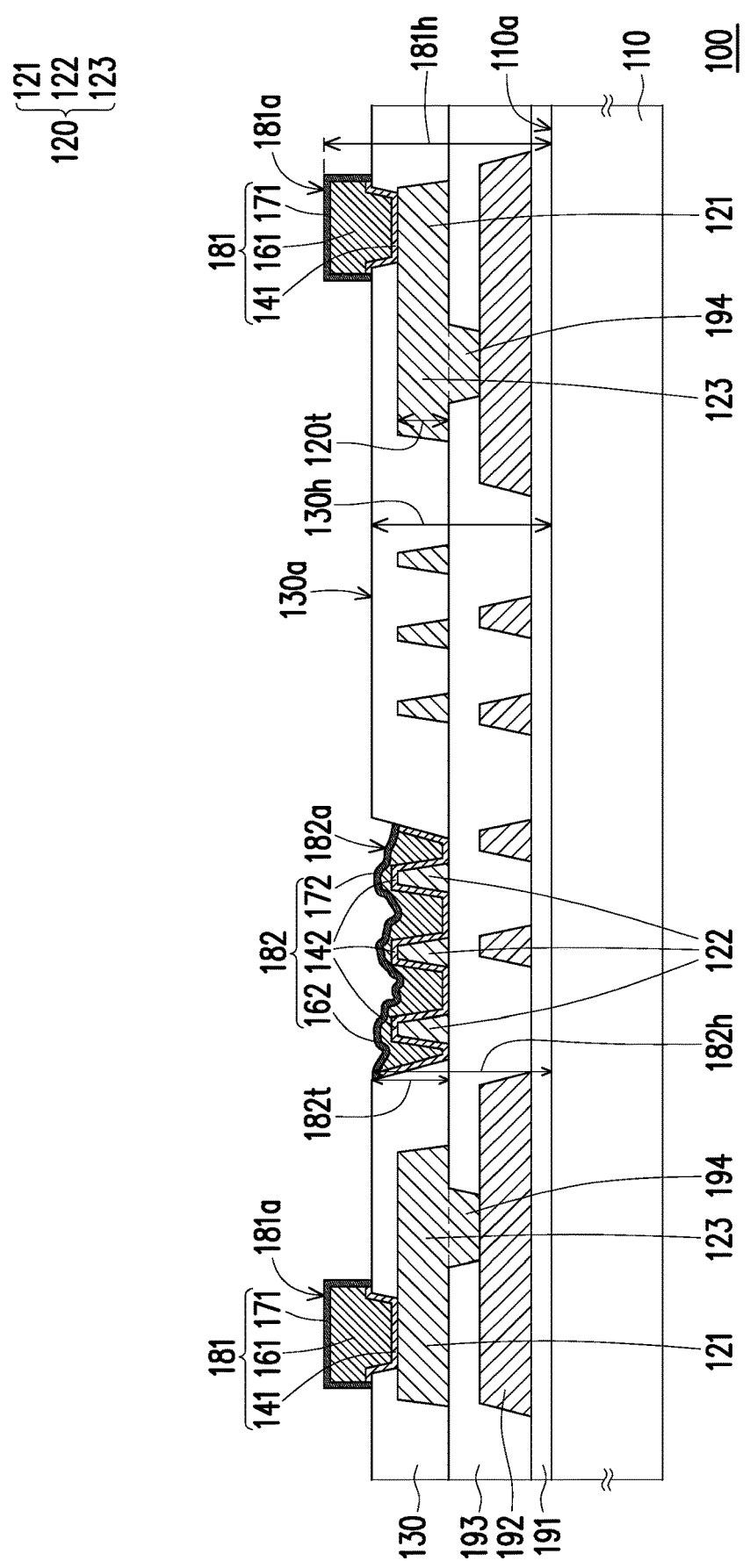
Figure 1H:
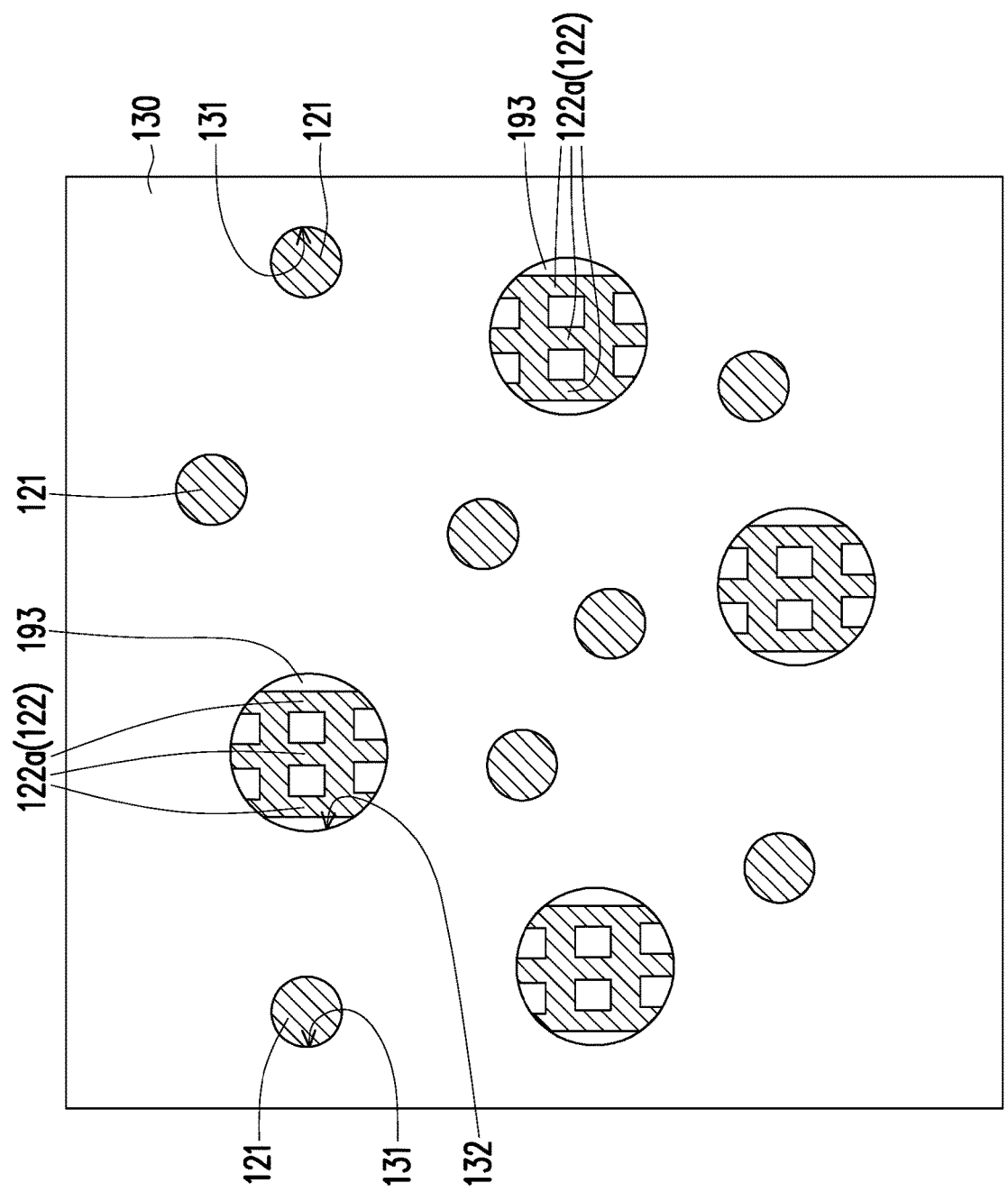
FIG. 1H is a top view of a manufacturing method of a circuit board according to a first embodiment of the invention.

Referring to FIG. 1B and FIG. 1H, after forming the patterned conductive layer 120, the patterned insulating layer 130 is formed on the first surface 110a of the substrate 110. The patterned insulating layer 130 covers a portion of the patterned conductive layer 120. For example, the patterned insulating layer 130 may cover the circuit area 123 of the patterned conductive layer 120. The patterned insulating layer 130 has a first insulating opening 131 and a second insulating opening 132. The first insulating opening 131 may expose the contact area 121 of the patterned conductive layer 120, and the second insulating opening 132 may expose the dummy plating area 122 of the patterned conductive layer 120. In addition, the patterned insulating layer 130 may be a single-layer insulating structure or a multilayer insulating structure, and the insulating material and the manner of forming the patterned insulating layer 130 are not limited in the invention.

In the embodiment, the dummy plating area 122 includes a plurality of strip structures 122a, but the invention is not limited thereto.

Referring to FIG. 1C, after forming the patterned insulating layer 130, a plating seed layer 140 is formed on the first surface 110a of the substrate 110. The plating seed layer 140 may be disposed on the patterned insulating layer 130 and a portion of the patterned conductive layer 120 that is not covered by the patterned insulating layer 130. For example, the plating seed layer 140 may cover the patterned insulating layer 130, the contact area 121 of the patterned conductive layer 120, and the dummy plating area 122 of the patterned conductive layer 120. That is, the plating seed layer 140 may be conformally covered on the patterned insulating layer 130 and a portion of the patterned conductive layer 120 that is not covered by the patterned insulating layer 130. In this way, the contact area 121 and the plating seed layer 122 may be electrically connected to each other by the plating seed layer 140. In addition, the plating seed layer 140 may be a single-layer conductive structure or a multilayer conductive structure, and the conductive material and the manner of forming the plating seed layer 140 are not limited in the invention.

Referring to FIG. 1D, after forming the plating seed layer 140, a plating mask layer 150 is formed on the plating seed layer 140. The plating mask layer 150 is disposed on a portion of the plating seed layer 140. The plating mask layer 150 has a plating opening 151 and a dummy plating opening 152, the plating opening 151 is disposed corresponding to the contact area 121, and the dummy plating opening 152 is disposed corresponding to the plating area 122. In addition, the material and the manner of forming the plating mask layer 150 are not limited in the present invention.

For example, the plating seed layer 140 includes a first seed portion 141, a second seed portion 142, and a third seed portion 143. The first seed portion 141 is disposed at least corresponding to the contact area 121 of the patterned conductive layer 120. The second seed portion 142 is disposed at least corresponding to the dummy plating area 122 of the patterned conductive layer 120. The third seed portion 143 is disposed corresponding to the circuit area 123 of the patterned conductive layer 120. The plating mask layer 150 is disposed on the third seed portion 143 of the plating seed layer 140. The plating opening 151 of the plating mask layer 150 exposes the first seed portion 141 of the plating seed layer 140. The dummy plating opening 152 of the plating mask layer 150 exposes the second seed portion 142 of the plating seed layer 140.

In the embodiment, the ratio of the sum of the opening area of the plating opening 151 and the opening area of the dummy plating opening 152 to the surface area of the first surface 110a is greater than or equal to 10% and less than 100%. As such, in the subsequent electroplating process, the possibility of flash plating or skip plating may be reduced.

In the embodiment, the ratio of the opening area of the plating opening 151 to the surface area of the first surface 110a is greater than or equal to 1% and less than or equal to 5%. In general, the position or area of the plating opening 151 is configured in accordance with the specifications of the product. Therefore, in the subsequent electroplating process, the entire plating area may be increased by the dummy plating opening 152, and the possibility of flash plating or skip plating within the plating opening 151 may be reduced.

Referring to FIG. 1E, after forming the plating mask layer 150, a plating layer 160 is formed in the plating opening 151 and the dummy plating opening 152. The plating layer 160 includes a first plating portion 161 and a second plating portion 162. The first plating portion 161 is disposed within the plating opening 151, and the second plating portion 162 is disposed within the dummy plating opening 152. The plating layer 160 is formed by an electroplating process, and the plating layer 160 may be a single-layer conductive structure or a multilayer conductive structure. For example, the substrate 110 and the structure thereon (e.g., as shown in FIG. 1D) may be immersed in a plating solution (not shown), and then a plating electrode (not shown) may be electrically connected to the plating seed layer 140 and energized. The plating layer 160 is electroplated on a portion of the plating seed layer 140 that is not covered by the plating mask layer 150.

In the embodiment, the opening area of the plating opening 151 may be smaller than the opening area of the dummy plating opening 152. In this way, the height of the first plating portion 161 can be made larger than the height of the second plating portion 162.

Referring to FIG. 1F, after forming the plating layer 160, the plating mask layer 150 (shown in FIG. 1E) and a portion of the plating seed layer 140 (shown in FIG. 1E) are removed, and a conductive terminal 181 corresponding to the contact area 121 and a dummy terminal 182 corresponding to the dummy plating area 122 may be formed.

For example, the plating mask layer 150 may be removed first to expose the third seed portion 143 of the plating seed layer 140 (shown in FIG. 1E). The plating mask layer 150 may be removed by a suitable process (e.g., ashing process or etching process) depending on the material of the plating mask layer 150, but the invention is not limited thereto.

Then, after exposing the third seed portion 143 of the plating seed layer 140, the plating layer 160 (shown in FIG. 1E) may be used as a mask to remove the third seed portion 143 of the plating seed layer 140. The third seed portion 143 of the plating seed layer 140 may be removed by a suitable process (e.g., etching process) depending on the material of the plating seed layer 140, but the invention is not limited thereto.

In an embodiment, after removing the third seed portion 143 of the plating seed layer 140, the first seed portion 141 of the plating seed layer 140 and the first plating portion 161 of the plating layer 160 may be electrically separated from the second seed portion 142 of the plating seed layer 140 and the second plating portion 162 of the plating layer 160.

In an embodiment, in the step of removing the third seed portion 143 of the plating seed layer 140, a portion of the plating layer 160, a portion of the first seed portion 141 of the plating seed layer 140, and/or a second seed portion 142 of the plating seed layer 140 may further be removed slightly. For example, in a wet etching or other similar anisotropic etching process, a portion of the plating layer 160, a portion of the first seed portion 141 of the plating seed layer 140, and/or a second seed portion 142 of the plating seed layer 140 may further be removed slightly.

After removing the third seed portion 143 of the plating seed layer 140, the first seed portion 141 and the first plating portion 161 may constitute the conductive terminal 181; and the second seed portion 142 and the second plating portion 162 may constitute the dummy terminal 182. That is, the conductive terminal 181 at least includes the first seed portion 141 and the first plating portion 161; and the dummy terminal 182 at least includes the second seed portion 142 and the second plating portion 162.

Referring to FIG. 1G, in an embodiment, after removing the third seed portion 143 of the plating seed layer 140 (shown in FIG. 1E), a conductive protective layer 171 may be formed on the first seed portion 141 and the first plating portion 161, and a conductive protective layer 172 may be formed on the second seed portion 142 and the second plating portion 162. The conductive protective layers 171 and 172 are, for example, an electroless nickel electroless palladium immersion gold (ENEPIG) layer, but the invention is not limited thereto. The conductive protective layer 171 may enhance the bonding of the conductive terminals 181 with other electronic components. The conductive protective layers 171 and 172 may reduce damage (e.g., oxidation) of the first seed portion 141, the first plating portion 161, the second seed portion 142, and the second plating portion 162. In other words, the first seed portion 141, the first plating portion 161, and the conductive protective layer 171 (if any) may constitute the conductive terminal 181; and the second seed portion 142, the second plating portion 162, and the conductive protective layer 172 (if any) may constitute the dummy terminal 182. That is, the conductive terminal 181 may include the first seed portion 141, the first plating portion 161, and the conductive protective layer 171 (if any); and the dummy terminal 182 may include the second seed portion 142, the second plating portion 162, and the conductive protective layer 172 (if any).

Referring to FIG. 1G and FIG. 1I, after the above manufacturing process is performed, a circuit board 100 provided in the present embodiment is substantially formed. The circuit board 100 includes a substrate 110, a patterned conductive layer 120, a patterned insulating layer 130, at least one conductive terminal 181, and at least one dummy terminal 182. The patterned conductive layer 120 is disposed on the substrate 110. The patterned insulating layer 130 is disposed on the substrate 110 and at least covers a portion of the patterned conductive layer 120. The conductive terminal 181 is disposed on the patterned conductive layer 120. The dummy terminal 182 is disposed on the patterned conductive layer 120. The conductive terminal 181 has a first top surface 181a (e.g., a surface of the conductive terminal 181 that is furthest from the first surface 110a of the substrate 110). The first top surface 181a and the substrate 110 have a first height 181h therebetween. The dummy terminal 182 has a second top surface 182a (e.g., a surface of the dummy terminal 182 that is furthest from the first surface 110a of the substrate 110). The second top surface 182a and the substrate 110 have a second height 182h therebetween. The first height 181h is greater than the second height 182h. In this way, when the other electronic component(s) (e.g., a chip) is/are bonded to the circuit board 100 (e.g., a chip is bonded to the circuit board 100 by flip-chip bonding), the possibility that the aforementioned electronic component touches the dummy terminal 182 may be reduced.

In the embodiment, the number of conductive terminals 181 and/or the number of dummy terminals 182 is not limited.

In terms of process, the projected area of the conductive terminal 181 on the first surface 110a is substantially the same or similar to the opening area of the plating opening 151 (shown in FIG. 1E) of the plating mask layer 150 (shown in FIG. 1E); and the projected area of the dummy terminal 182 on the first surface 110a is substantially the same or similar to the open area of the dummy plating opening 152 (shown in FIG. 1E) of the plating mask layer 150. That is, the ratio of the sum of the projected area of the conductive terminal 181 on the first surface 110a and the projected area of the dummy terminal 182 on the first surface 110a to the surface area of the first surface 110a is substantially greater than or equal to 10% and less than 100%. That is, the ratio of the projected area of the conductive terminal 181 on the first surface 110a to the surface area of the first surface 110a is substantially greater than or equal to 1% and less than or equal to 5%.

In the embodiment, the projected area of the conductive terminal 181 on the first surface 110a is smaller than the projected area of the dummy terminal 182 on the first surface 110a.

In the embodiment, the conductive terminal 181 may be electrically separated from the dummy terminal 182 from each other, but the invention is not limited thereto. In an embodiment, the dummy terminal 182 of the circuit board 100 may be an isolated electrical conductor. That is, in an embodiment, the dummy terminal 182 may not be electrically connected to other electrical conductors, and the plurality of dummy terminals 182 are not electrically connected to each other.

In the embodiment, the patterned insulating layer 130 has a third top surface 130a, the third top surface 130a and the substrate 110 have a third height 130h therebetween, and the third height 130h is greater than the second height 182h, but the invention is not limited thereto.

In the embodiment, the maximum thickness 182t of the dummy terminal 182 is greater than the thickness 120t of the patterned conductive layer 120, but the invention is not limited thereto.

In the embodiment, the surface roughness of the first top surface 181a is smaller than the surface roughness of the second top surface 182a, but the invention is not limited thereto.

Figure 2A:
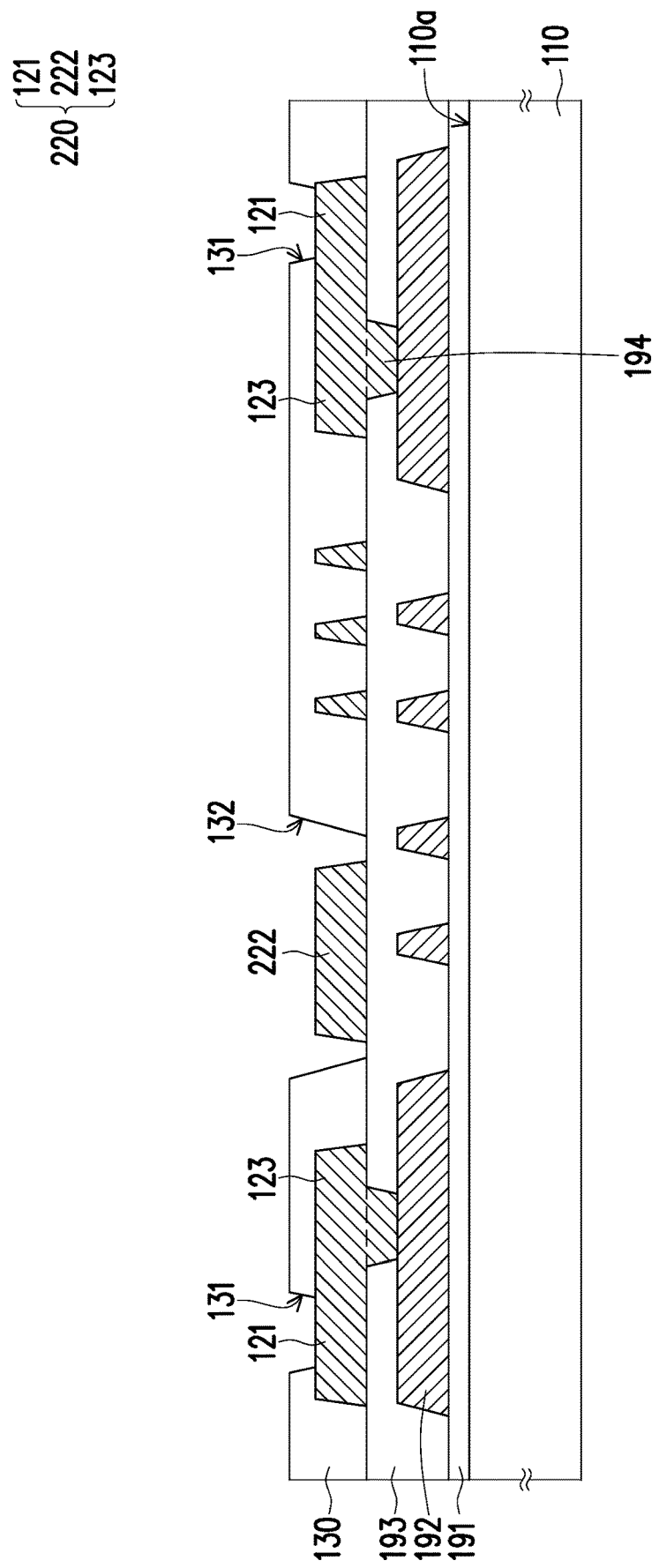
FIG. 2A to FIG. 2B are cross-sectional views of a manufacturing method of a circuit board according to a second embodiment of the invention.
Figure 2B:
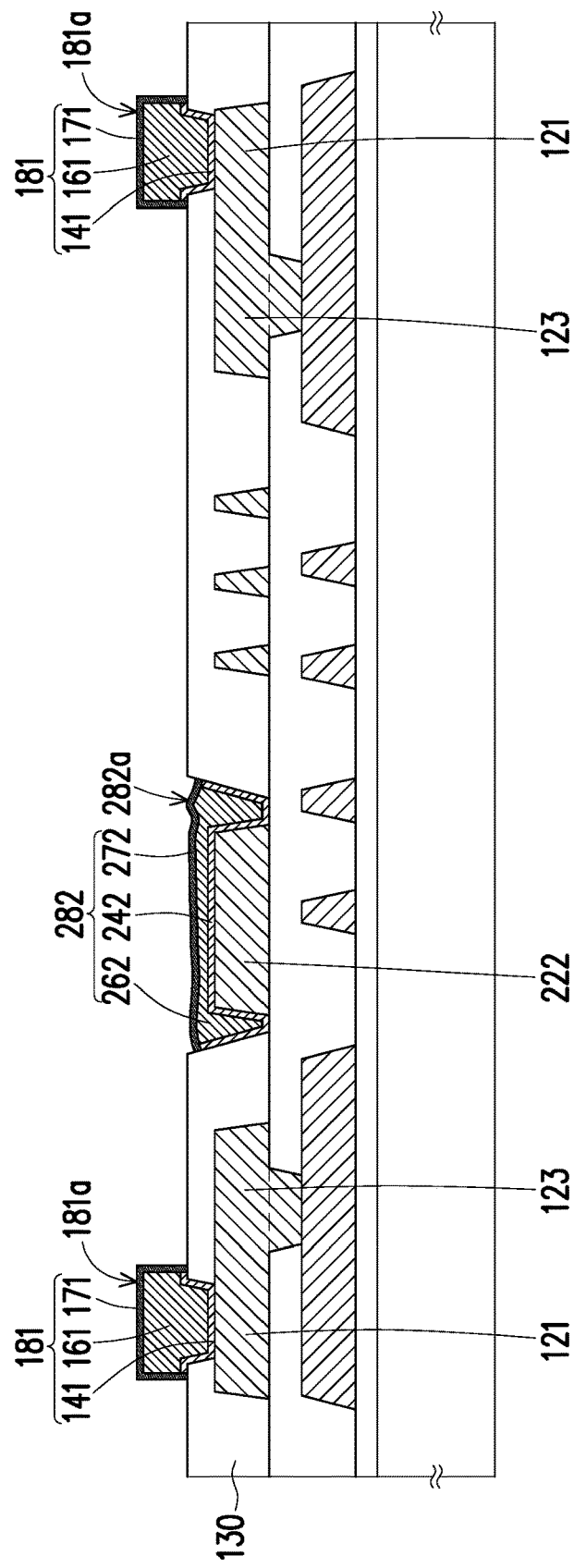
Figure 2C:
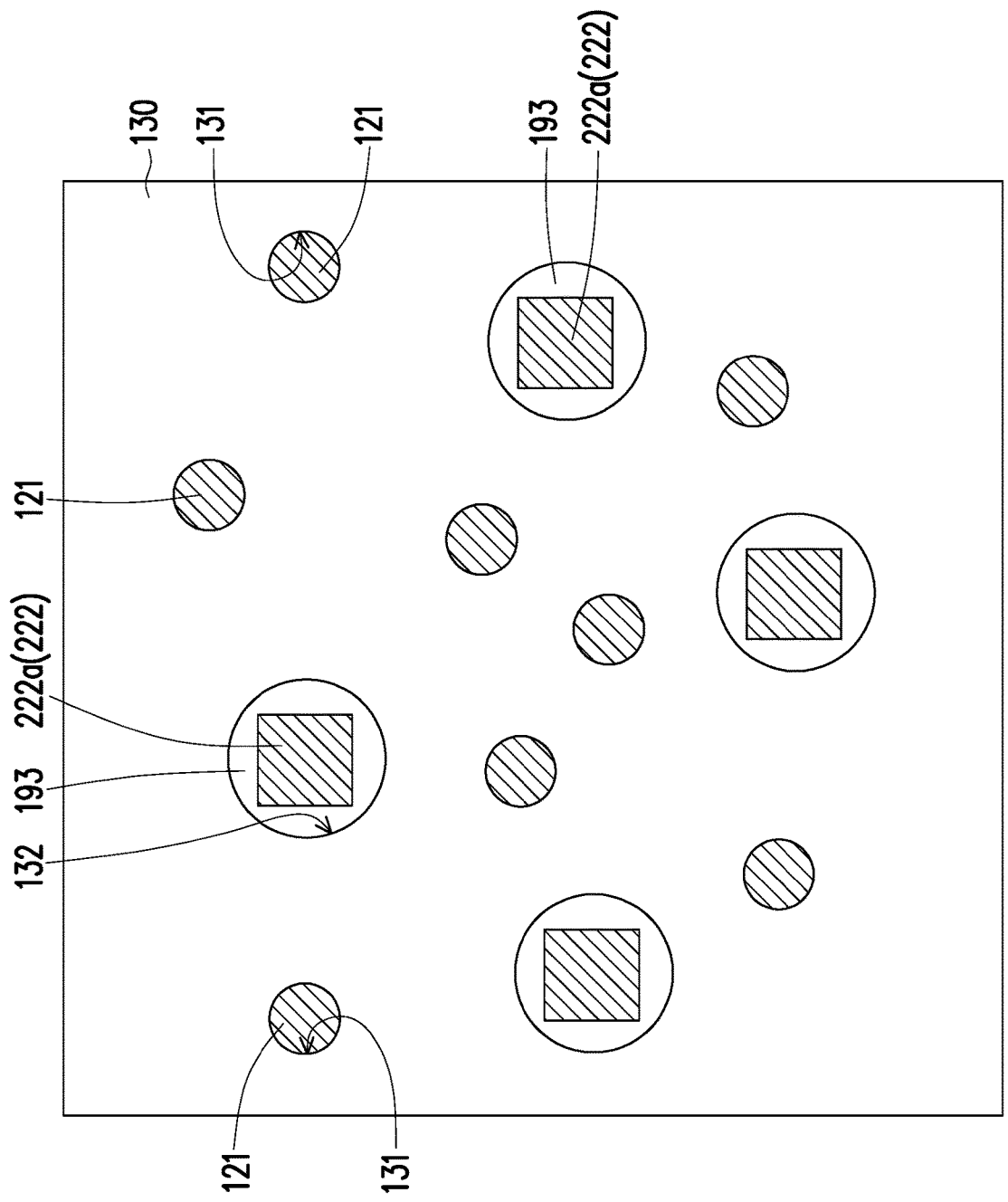
FIG. 2C is a top view of a manufacturing method of a circuit board according to a second embodiment of the invention.

FIG. 2A to FIG. 2B are cross-sectional views of a manufacturing method of a circuit board according to a second embodiment of the invention. FIG. 2C is a top view of a manufacturing method of a circuit board according to a second embodiment of the invention. For example, FIG. 2C may be a top view corresponding to the structure in FIG. 2A. Further, a part of the film layer or element may be omitted in FIG. 2A to FIG. 2C for clarity.

Referring to FIG. 2A and FIG. 1A, a patterned conductive layer 220 is formed on the substrate 110 similar to the step illustrated in FIG. 1A. The patterned conductive layer 220 may include a contact area 121, a dummy plating area 222, and a circuit area 123. The circuit area 123 is connected to the contact area 121, and the dummy plating area 222 and the contact area 121 are separated from each other.

Referring to FIGS. 2A, 2C and 1B, after forming the patterned conductive layer 220, the patterned insulating layer 130 is formed on the first surface 110a of the substrate 110. The patterned insulating layer 130 covers a portion of the patterned conductive layer 220. For example, the patterned insulating layer 130 may cover the circuit area 123 of the patterned conductive layer 220. The first insulating opening 131 may expose the contact area 121 of the patterned conductive layer 220, and the second insulating opening 132 may expose the dummy plating area 222 of the patterned conductive layer 220.

The patterned conductive layer 220 of the present embodiment is similar to the patterned conductive layer 120 of the first embodiment, with the difference that the dummy plating area 222 includes a plurality of block structures 222b.

Referring to FIG. 2A to FIG. 2B and FIG. 1B to FIG. 1G, after forming the patterned conductive layer 220, the fabrication of the circuit board 200 of the embodiment may be substantially provided by steps similar to those illustrated in FIG. 1B to FIG. 1G.

The circuit board 200 of the present embodiment is similar to the circuit board 100 of the first embodiment. In the embodiment, the dummy terminal 282 may include a second seed portion 242, a second plating portion 262, and a conductive protective layer 272 (if any). Compared with the circuit board 100 of the first embodiment, the surface roughness of the second top surface 282a of the dummy terminal 282 of the circuit board 200 may be smaller than the surface roughness of the second top surface 182a of the dummy terminal 182 of the circuit board 100.

In the embodiment, the surface roughness of the first top surface 181a is smaller than the surface roughness of the second top surface 282a, but the invention is not limited thereto.

Figure 3A:
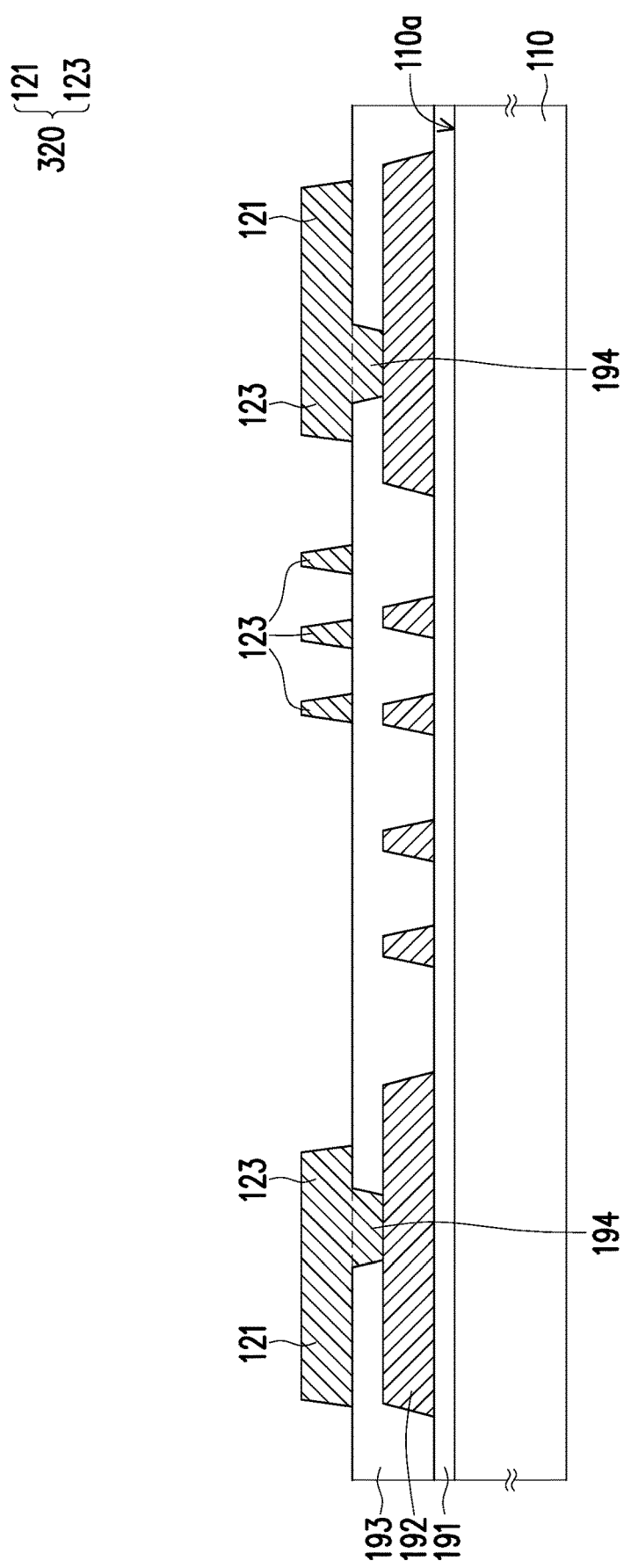
FIG. 3A to FIG. 3C are cross-sectional views of a manufacturing method of a circuit board according to a third embodiment of the invention.
Figure 3B:
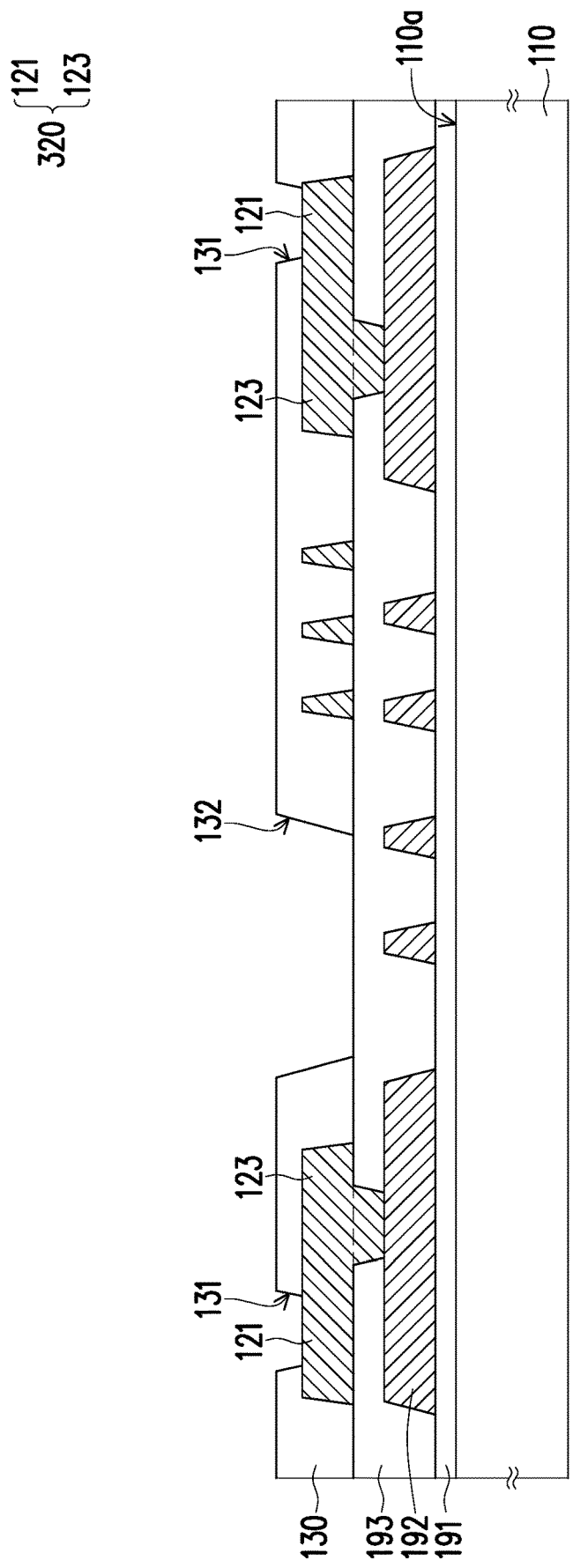
Figure 3C:
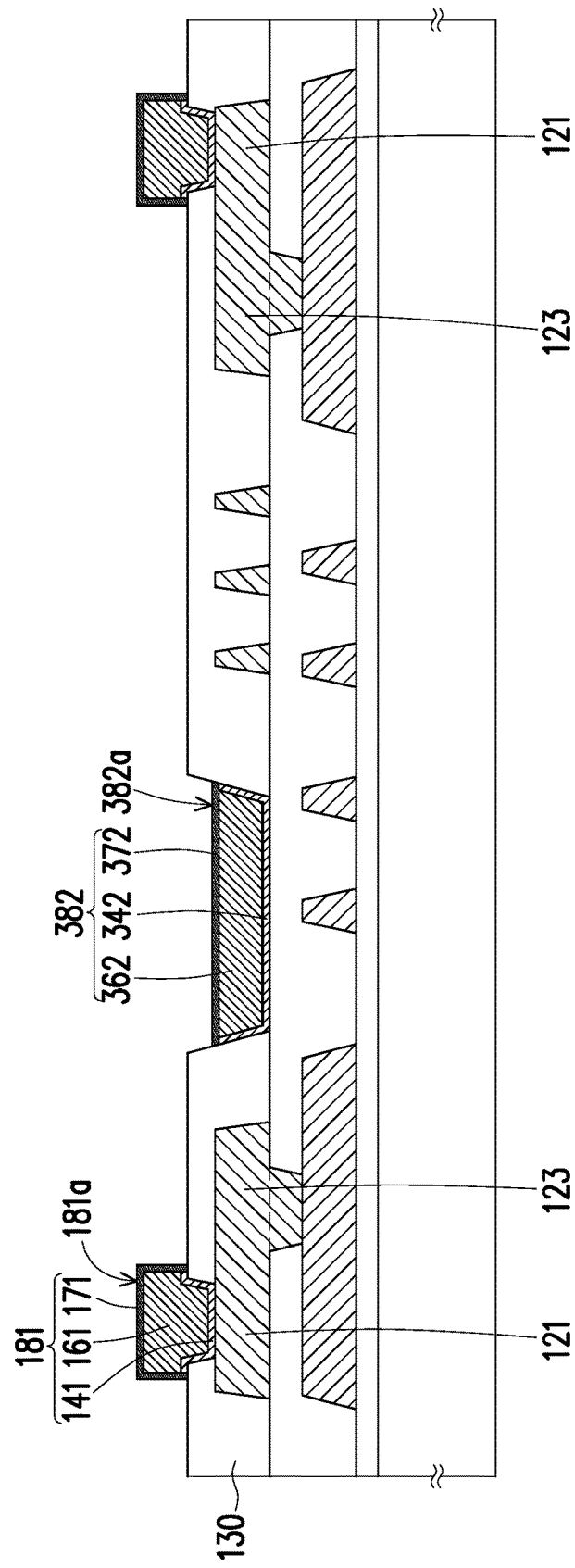
Figure 3D:
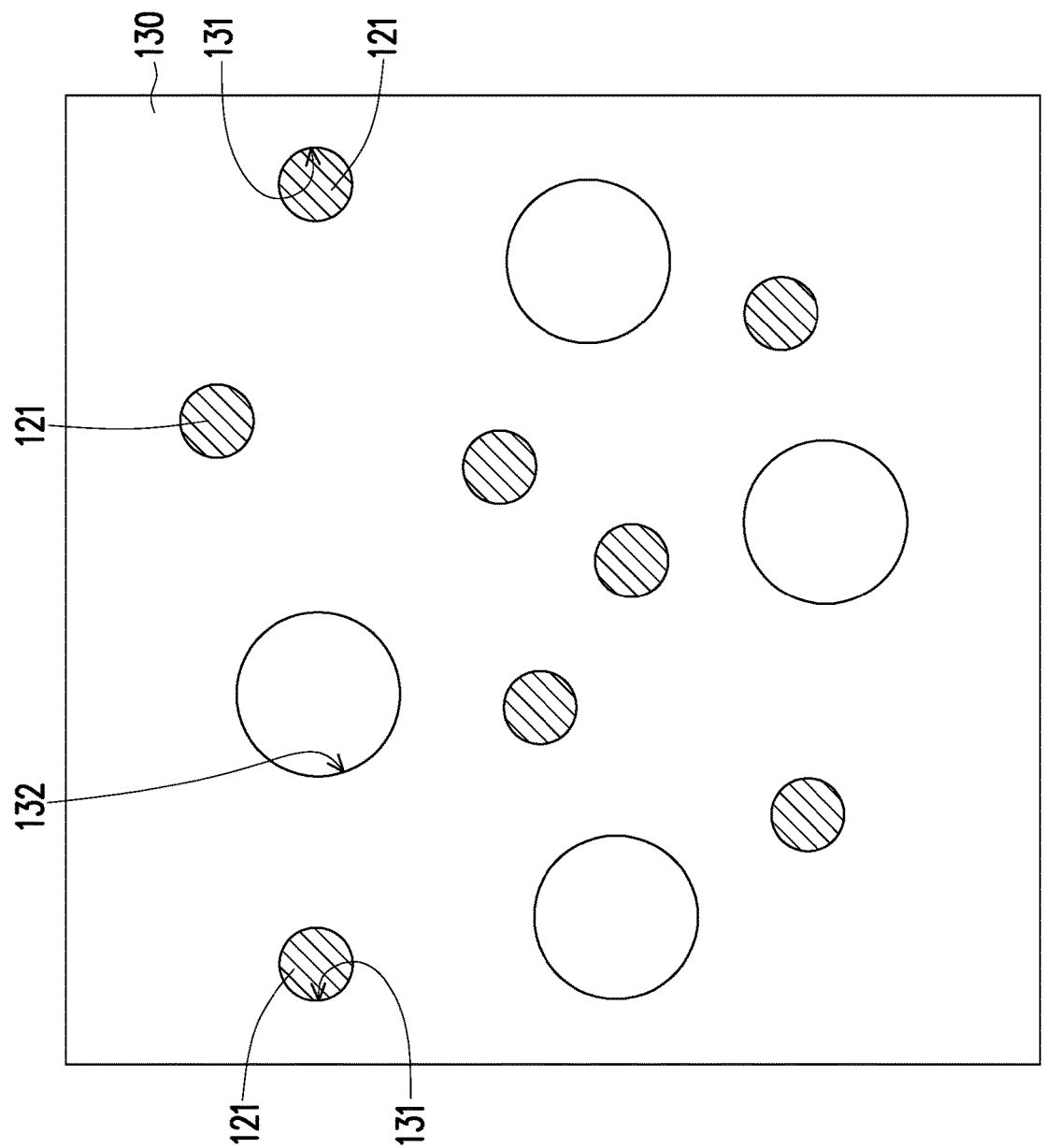
FIG. 3D is a top view of a manufacturing method of a circuit board according to a third embodiment of the invention.

FIG. 3A to FIG. 3C are cross-sectional views of a manufacturing method of a circuit board according to a third embodiment of the invention. FIG. 3D is a top view of a manufacturing method of a circuit board according to a third embodiment of the invention. For example, FIG. 3D may be a top view corresponding to the structure in FIG. 3B. Further, a part of the film layer or element may be omitted in FIG. 3A to FIG. 3D for clarity.

Referring to FIG. 3A, a patterned conductive layer 320 is formed on the first surface 110a of the substrate 110 similar to the step of FIG. 1A. The patterned conductive layer 320 may include a contact area 121 and a circuit area 123.

Referring to FIGS. 3A, 3D and 1B, after forming the patterned conductive layer 320, the patterned insulating layer 130 is formed on the first surface 110a of the substrate 110 similar to the step of FIG. 1B. The patterned insulating layer 130 covers a portion of the patterned conductive layer 320. For example, the patterned insulating layer 130 may cover the circuit area 123 of the patterned conductive layer 320. The first insulating opening 131 may expose the contact area 121 of the patterned conductive layer 320, and no conductive layer (e.g., the patterned conductive layer 320) may be exposed within the opening area of the second insulating opening 132.

Referring to FIG. 3B to FIG. 3C and FIG. 1B to FIG. 1G, after forming the patterned insulating layer 130, the fabrication of the circuit board 300 of the embodiment may be substantially provided by steps similar to those illustrated in FIG. 1B to FIG. 1G. For example, in a step similar to FIG. 1D, the opening area of the dummy plating opening 152 (shown in FIG. 1D) may not be overlapped with the patterned conductive layer 320. As such, the formed dummy terminals 382 may not overlap the patterned conductive layer 320.

The circuit board 300 of the present embodiment is similar to the circuit board 100 of the first embodiment. In the embodiment, the dummy terminal 382 may include a second seed portion 342, a second plating portion 362, and a conductive protective layer 372 (if any). Compared with the circuit board 100 of the first embodiment, the surface roughness of the second top surface 382a of the dummy terminal 382 of the circuit board 300 may be smaller than the surface roughness of the second top surface 182a of the dummy terminal 182 of the circuit board 100.

In the embodiment, the surface roughness of the first top surface 181a may be substantially equal to the surface roughness of the second top surface 382a.

In summary, in the manufacturing method of a circuit board of the present invention, the plating area in an electroplating process may be improved by a dummy plating opening. As such, in the electroplating process, the possibility of flash plating or skip plating may be reduced, and the yield or quality of the circuit board may be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit board comprising:
   a substrate;
   a patterned conductive layer disposed on the substrate;
   a patterned insulating layer disposed on the substrate and at least covering a portion of the patterned conductive layer, the patterned insulating layer has a third top surface;
   a conductive terminal disposed on the patterned conductive layer and having a first top surface; and
   a dummy terminal disposed on the patterned conductive layer and having a second top surface, wherein a first height between the first top surface and the substrate is greater than a second height between the second top surface and the substrate, and the first height between the first top surface and the substrate is greater than a third height between the third top surface and the substrate,
   wherein the patterned insulating layer has an insulating opening, and the dummy terminal is embedded in the insulating opening,
   wherein the dummy terminal comprises a plating seed layer and a plating layer, the plating layer is disposed on the plating seed layer and physically separated from the patterned insulating layer,
   wherein the plating seed layer covers a bottom surface of the insulating opening and a side wall of the insulating opening, another plating layer disposed under the plating seed layer has a mesh pattern, and top and side surfaces of the mesh pattern are covered by the plating seed layer.

2. The circuit board of claim 1, wherein the conductive terminal and the dummy terminal are electrically separated from each other.

3. The circuit board of claim 1, wherein:
   the substrate has a first surface;
   the patterned conductive layer is disposed on the first surface of the substrate; and
   a ratio of a sum of a projected area of the conductive terminal on the first surface and a projected area of the dummy terminal on the first surface to a surface area of the first surface is greater than or equal to 10% and less than 100%.

4. The circuit board of claim 3, wherein a ratio of the projected area of the conductive terminal on the first surface to the surface area of the first surface is greater than or equal to 1% and less than or equal to 5%.

5. The circuit board of claim 1, wherein:
   the third height between the third top surface and the substrate is greater than the second height between the second top surface and the substrate.

6. The circuit board of claim 1, wherein:
   the substrate has a first surface;
   the patterned conductive layer is disposed on the first surface of the substrate; and
   a projected area of the conductive terminal on the first surface is smaller than a projected area of the dummy terminal on the first surface.

7. The circuit board of claim 1, wherein a maximum thickness of the dummy terminal is greater than a thickness of the patterned conductive layer.

8. The circuit board of claim 7, wherein a surface roughness of the first top surface is smaller than a surface roughness of the second top surface.

9. The circuit board of claim 1, wherein a surface roughness of the first top surface is substantially equal to a surface roughness of the second top surface.

* * * * *